United States Patent [19]

Katsumata et al.

[11] Patent Number: 5,420,756
[45] Date of Patent: May 30, 1995

[54] MEMORY CARD INCLUDING STACKED SEMICONDUCTOR MEMORY ELEMENTS LOCATED ON A PRINTED CIRCUIT BOARD HAVING A STRAIGHT WIRING PATTERN

[75] Inventors: Akio Katsumata, Yokohama; Kimihiro Ikebe, Urayasu, both of Japan

[73] Assignee: Kabushiki Kaisha Toshiba, Kawasaki, Japan

[21] Appl. No.: 77,080

[22] Filed: Jun. 16, 1993

[30] Foreign Application Priority Data

Jun. 19, 1992 [JP] Japan .................................. 4-160965

[51] Int. Cl.⁶ ............................................. H05K 7/02
[52] U.S. Cl. .................................. 361/783; 174/260; 174/261; 257/724; 257/777; 361/760; 361/764; 361/772; 361/773; 361/777; 361/807; 361/820
[58] Field of Search ..................... 174/253, 260, 261; 235/492, 495; 257/668, 679, 690, 700, 724, 777, 784; 228/180.21, 180.22; 361/684, 735, 736, 737, 738, 760, 763, 764, 772, 776, 782, 783, 807, 808, 820; 437/205, 208, 915; 439/68, 69, 70–72

[56] References Cited

U.S. PATENT DOCUMENTS

| 4,982,265 | 1/1991 | Watanabe et al. | 174/52.4 |
| 4,994,896 | 2/1991 | Uemura et al. | 257/700 |
| 4,996,583 | 2/1991 | Hatada | 257/724 |

FOREIGN PATENT DOCUMENTS

| 59-144155 | 8/1984 | Japan | 257/724 |
| 63-84057 | 4/1988 | Japan | 257/692 |
| 63-141329 | 6/1988 | Japan | 257/784 |
| 1-76748 | 3/1989 | Japan | 257/724 |
| 2-86139 | 3/1990 | Japan | 361/820 |
| 4-26152 | 1/1992 | Japan | 257/668 |
| 4-61260 | 2/1992 | Japan | 257/693 |
| 4-79260 | 3/1992 | Japan | 257/692 |
| 4-214695 | 8/1992 | Japan | 361/783 |
| 4-291787 | 10/1992 | Japan | 361/783 |
| 4-329692 | 11/1992 | Japan | 361/820 |
| 5-152492 | 6/1993 | Japan | 257/694 |

OTHER PUBLICATIONS

Research Disclosure, "Lead Format For First Level Circuit Packages" Oct. 1990 No. 318.

*Primary Examiner*—Leo P. Picard
*Assistant Examiner*—Donald A. Sparks
*Attorney, Agent, or Firm*—Finnegan, Henderson, Farabow, Garrett & Dunnar

[57] ABSTRACT

TCP (tape carrier package) type semiconductor memory elements, each having a thickness less than that of the conventional package, are provided on the front and rear surface of a print circuit board in a stacking manner. Close to the semiconductor memory elements stacked, provided are TCP type semiconductor memory elements stacked one on another. Each TCP type semiconductor memory element has outer leads on its one side surface. The outer leads having the same function are arranged in a straight line on the front or rear surface of the print substrate. The outer leads arranged in the straight line are connected with each other via a straight wiring pattern.

15 Claims, 3 Drawing Sheets

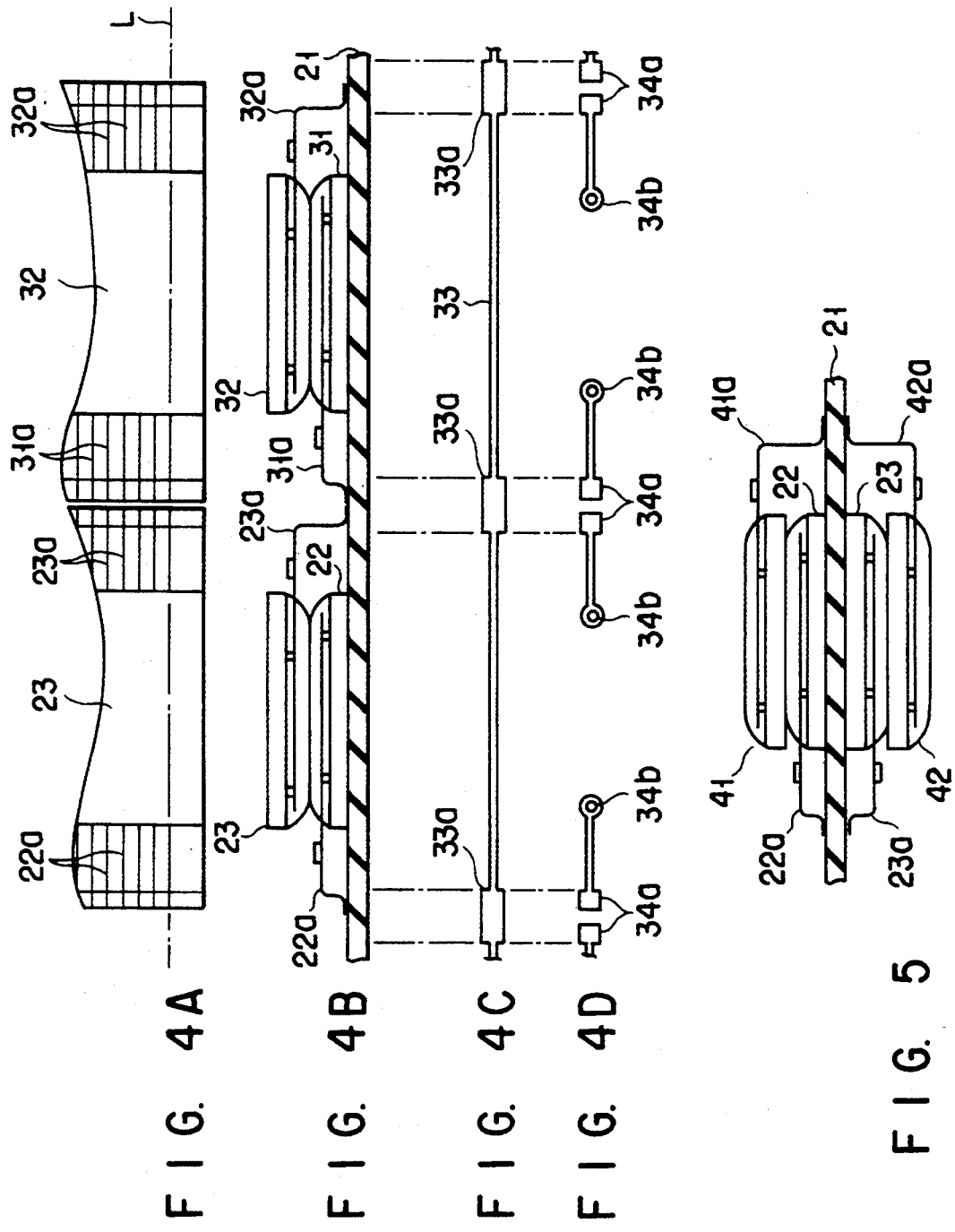

MEMORY CARD INCLUDING STACKED SEMICONDUCTOR MEMORY ELEMENTS LOCATED ON A PRINTED CIRCUIT BOARD HAVING A STRAIGHT WIRING PATTERN

BACKGROUND OF THE INVENTION

1. Field of the Invention

The present invention relates to a memory card used as a memory device for a personal computer, a work station, or the like.

2. Description of the Related Art

FIG. 8 is a diagram showing a cross section of a part of a conventional general type memory card.

In a memory card 10, there is provided a printed circuit board 11. Semiconductor memory elements 12 and 13, each of which is, for example, a 16 M-bit EEPROM (electrically erasable programmable ROM) contained in a TSOP (thin small outline package), are provided on both sides of the print substrate on the front and rear sides of the memory card 10, respectively formed are insulation plates 14 and 15, and stainless steel-made design plates 16 and 17. In practice, eight semiconductor memory elements are arranged on each of the front and rear sides of the printed circuit board 11, and therefore there are total of sixteen semiconductor memory elements in the memory card.

In general, the thickness of the print substrate is 0.40 mm, and the thickness of one semiconductor memory is 1.20 mm. Accordingly, the total thickness of one print substrate and two semiconductor memory elements is 2.8 mm. Further, the total thickness of two pairs of the insulation plates and the design plates is 0.5 mm. In total, the thickness of the memory card 10 is 3.3 mm.

The memory capacity of a standard-size memory card is limited by the package size of the TSOP in the horizontal plane direction, and by the thickness of the package of the TSOP in the vertical thickness direction. Hence, as mentioned above, a conventional standard-size memory card can pack only sixteen semiconductor memory elements therein.

Further, such a TSOP has outer leads extending from both sides thereof. In a particular case, as shown in FIG. 9, where semiconductor memory elements 12A and 12B are arranged on the same plane of a print circuit board 11 such that the memory elements are adjacent with each other in the direction perpendicular to the arrangement of the outer leads, and the outer leads of the memory elements which have the same function are connected to each other, it is almost impossible to keep the connection wiring pattern straight. As shown in the figure, the wiring pattern 18 must be bent, and therefore the designing of the wiring pattern is very limited. In addition, when a wiring pattern is formed bent as in the above case, the length of the wiring is inevitably increased, and the lengthy wiring can easily be influenced by noise.

SUMMARY OF THE INVENTION

The purpose of the invention is to provide a memory card having the same size as a conventional type, but having an high packaging density with an increased memory capacity, involving a wiring pattern which can be easily designed, and being rarely influenced by noise.

The purpose of the present invention can be achieved by a memory card device comprising:

a printed circuit board;

a first semiconductor memory provided on one side of the printed circuit board, the first semiconductor memory having a plurality of leads extending from one side thereof;

a second semiconductor memory provided in a back-to-back manner with respect to the first semiconductor memory, the second semiconductor memory having a plurality of leads extending from a side of the second semiconductor memory element not corresponding with said one side of the first semiconductor memory; and a straight wiring pattern, provided on the print circuit board, for connecting the leads of the first and second semiconductor memory elements which having same function.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a plan view showing the main part of the present invention;

FIG. 4B is a diagram showing a cross section of the main part shown in FIG. 4A;

FIGS. 4C and 4D are plan views each showing a wiring pattern for connecting semiconductor devices illustrated in FIGS. 4A and 4B, respectively;

FIG. 5 is a diagram showing a cross section of the main part of the second embodiment of the present invention

DETAILED DESCRIPTION OF THE PREFERRED EMBODIMENTS

Embodiments of the present invention will now be described with reference to accompanying drawings.

In the present invention, a semiconductor memory of a TCP (tape carrier package) type is used.

Figure 3A:
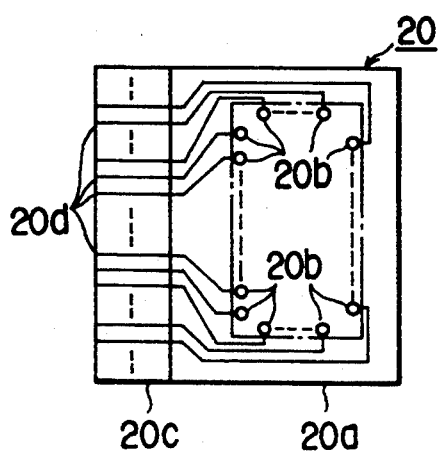
FIG. 3A is a plan view showing a semiconductor memory of a TCP type, to which the present invention is applied.
Figure 3C:
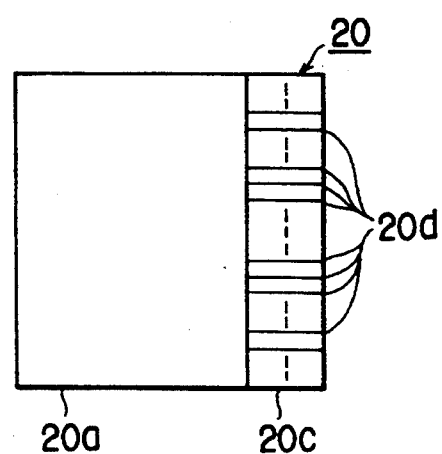
FIG. 3C is a diagram showing a rear view of the semiconductor memory shown in FIG. 3A.
Figure 3B:
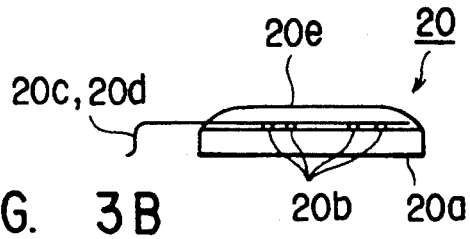
FIG. 3B is a diagram showing a side view of the semiconductor memory shown in FIG. 3A.

Each of FIGS. 3A, 3B, and 3C shows a TCP type semiconductor memory 20. In the semiconductor memory 20, a number of bumps 20b connected to inner circuits which are not shown, are arranged on the periphery portion of a semiconductor pellet 20a, and one end of each of the outer leads 20b formed on a tape carrier is connected to each of the bumps 20b. The other ends of the outer leads 20d are located on one side of the tape carrier 20c, and arranged along with the tape carrier 20c into a gull-wing shape. Further, the surface of each of the semiconductor pellet 20a and the tape carrier 20c is coated with insulating resin 20e.

As can be seen in FIGS. 3A and 3B, a TCP type semiconductor memory has outer leads arranged on one side. Therefore, even in the case where such a semiconductor memory is turned upside down as shown in FIG. 3, the relative arrangement and direction of the outer leads remains the same.

Figure 1:
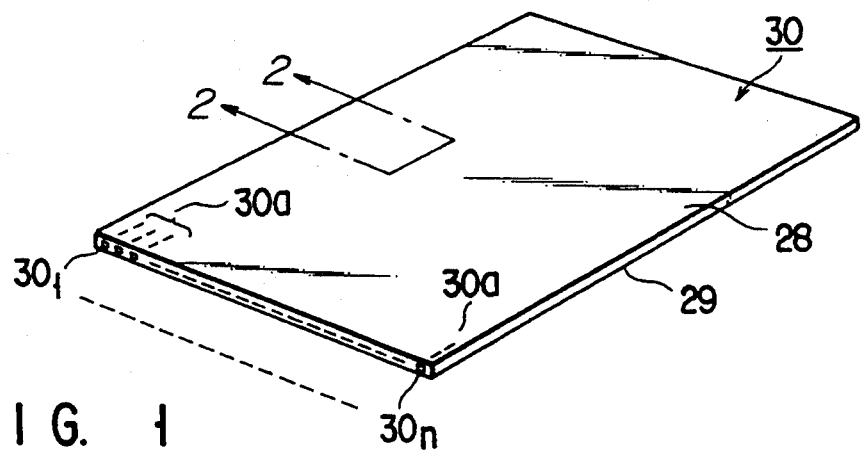
FIG. 1 is a perspective view showing an example of the memory card to which the present invention is applied.

FIG. 1 shows a memory card according to the present invention. The (main body of the) memory card 30 has a number of openings $30_1 - 30_n$ on one of the side faces, and in each of the openings $30_1 - 30_n$, contact element 30a is provided. Each contact element is connected to the semiconductor memory.

Figure 2:
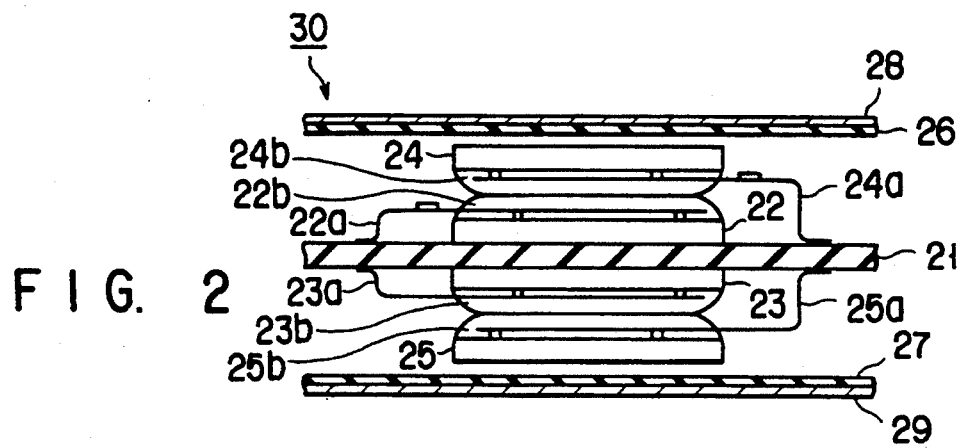
FIG. 2 is a diagram showing a cross section of the first embodiment of the present invention, taken along the 2—2 in FIG. 1.

FIG. 2 shows an internal structure of the memory card shown in FIG. 1, which is the first embodiment of the present invention. In FIG. 2, the first to fourth semiconductor memory elements 22-25 have the same structure as the semiconductor memory 20 shown in FIGS. 3A to 3C. A printed circuit board 21 is provided in the memory card 30. The first semiconductor memory 22 is provided on the front surface of the print circuit board 21, while the second semiconductor memory 23 is on the rear surface thereof. Outer leads 22a and 23a of the semiconductor memory elements 22 and 23 are connected to wiring patterns (not shown) printed on the front and rear surfaces. The third semiconductor memory 24 is provided on the first semiconductor memory 22 in a face-to-face manner, and so is the fourth semiconductor memory 25 on the second semiconductor memory 23. More specifically, the resin 24b of the third semiconductor memory 24 is located in contact with the resin 22b of the first semiconductor memory 22, and the resin 25b of the fourth semiconductor memory 25 is located in contact with the resin 23b of the second semiconductor memory 23.

The outer leads 24a and 25a of the third and fourth semiconductor memory elements 24 and 25 are made longer than the outer leads 22a and 23a of the first and second semiconductor memory elements 22 and 23. The outer leads 24a and 25a are bent in the opposite direction to that of the outer leads 22a and 23a, and connected to wiring patterns (not shown) formed on the printed circuit board 21. The first to fourth semiconductor memory elements 22-24 are connected to the contact elements 30a provided in the openings $30_1 - 30_n$ via the wiring patterns, and the transmission and reception of address signals and data are carried out through the contact elements 30a. Further, the memory card (main body) 30 includes insulation plates 26 and 27, and design plates 28 and 29 in its front and rear surface portions for the purpose of protection of the first to fourth semiconductor memory elements 22-25, and the like.

The thickness of the print circuit board 21 is 0.4 mm, and the thickness of one semiconductor memory is 0.6 mm or less. Therefore, the total thickness of the printed circuit board 21, and the first to fourth semiconductor memory elements 22-25 is 2.8 mm or less. Further, the total thickness of the two pairs of the insulation plates and design plates is 0.5 mm. The thickness of the memory card as a whole is 3.3 mm (2.8 mm+0.5 mm), which is the same as the thickness of conventional memory cards. However, as compared to the conventional same-sized memory cards, twice as many semiconductor memory elements can be packed in the above-described memory card. More specifically, only sixteen semiconductor memory elements can be packed in a conventional card, whereas 32 of TCP type semiconductor memory elements (16M-bit EEPROM) can be packed in this embodiment.

Further, each TCP type semiconductor memory has outer leads only on one side. With such an arrangement, for example, all the outer leads 22a of the first semiconductor memory 22 used for receiving an address signal are located on the same line as all of the outer leads 24a of the third semiconductor memory 24 used for receiving an address signal. Consequently, these outer leads for receiving a signal can be connected with each other in a straight wiring pattern.

FIGS. 4A to 4D are designed to explain the structure of a wiring pattern used to connect outer leads with each other.

As shown in each of FIGS. 4A and 4B, a number of semiconductor memory elements 22, 23, 31, and 32 are stacked one on the other on the surface of the printed circuit board 21. The semiconductor memory elements 31 and 32 are located adjacent to each other in the direction perpendicular to the direction of the outer leads 22a and 23a of the semiconductor memory elements 22 and 23. Although not shown in the figures, a number of semiconductor memory elements are arranged on the rear surface of the printed circuit board 21 in a fashion similar to the front surface. As mentioned before, a TCP type semiconductor memory has outer leads only on its one side. Therefore the outer leads having the same function between the stacked and adjacent semiconductor memory elements are located in a straight line as shown in FIG. 4A. More specifically, of the outer leads 22a and 23a of the semiconductor memory elements stacked one on the other, for example, one of the outer leads 22a used for inputting an address signal, and one of the outer leads 23a used for the same function are located on the same line L as one of the signal inputting outer leads 31a and 32a of the semiconductor memory elements 31 and 32. Consequently, as can be seen in FIG. 4C, a wiring pattern 33 used for connecting these outer leads having the same function with each other, does not have to be bent, but can be made in a straight line fashion. The wiring pattern 33 has a number of connection pads 33a, through which each outer lead is connected to the wiring pattern 33.

FIG. 4D shows an example of a wiring pattern for connecting, for example, all the outer leads 22a, 23a, 31a, and 32a provided respectively in the semiconductor memory elements 22, 23, 31, and 32 for inputting-/outputting a data signal. A wiring pad 34a is provided at one end of each of the wiring patterns 34, and a through hole passage 34b is provided on the other end. Each through hole passage 34b is connected to a wiring pattern (not shown) formed inside or on the rear surface of the printed circuit board 21. The outer leads for inputting/outputting a data signal are connected to the corresponding wiring pads 34a.

According to the above-described embodiment, a TCP type semiconductor memory is thin as compared to the conventional memory elements. Therefore, by use of TCP type semiconductor cells, if stacked one on the other, twice as many semiconductor memory elements as the conventional memory elements can be packed in a memory card having the same thickness as the conventional cards. Thus, with the same thickness, the memory capacity can be doubled.

Further, with the TCP type semiconductor memory elements, in the case where outer leads of the same function of the memory elements stacked one on the other, or arranged adjacent to each other in the direction perpendicular to the arrangement of the outer leads, are connected with each other, the wiring pattern can be made straight. Therefore, there is less limitation in terms of designing a wiring pattern, and therefore the degree of freedom can be improved as compared to the conventional case. Further, since the wiring pattern can be shortened to half of the conventional case, the influence of noise can be reduced.

Figure 6:
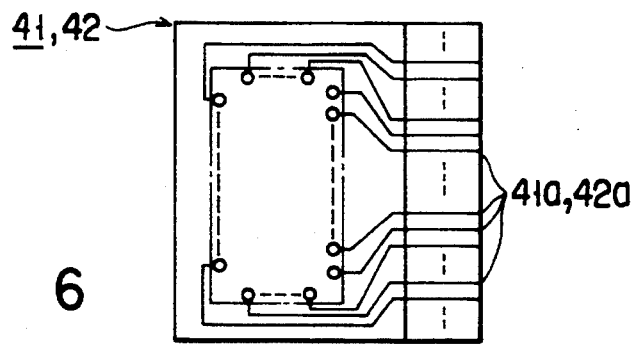
FIG. 6 is a plan view showing an example of the semiconductor memory shown in FIG. 5.

FIG. 5 shows the second embodiment of the present invention. In this embodiment, the same structural items are designated by the same reference numerals, and the explanations will be made in connection to the difference from the other embodiment. In the first embodiment, the first to fourth semiconductor memory elements are constituted by the same element, whereas in this embodiment, the third and fourth semiconductor memory elements 41 and 42 have structures symmetrical to those of the first and second semiconductor memory elements. In short, the semiconductor memory element shown in FIGS. 3A to 3C has the outer leads on the left-hand side of the pellet, whereas the third and fourth semiconductor memory elements 41 and 42 have the outer leads 41a and 42a on the right-hand side of each pellet, as shown in FIG. 6.

In the first embodiment, the third and fourth semiconductor elements 24 and 25 are arranged in a face-to-face manner with respect to the first and second semiconductor memory elements 22 and 23. In contrast, the third and fourth semiconductor memory elements 41 and 42 of this embodiment are stacked on the first and second semiconductor memory elements 22 and 23 in the same direction.

As described, the third and fourth semiconductor memory elements 41 and 42 have a structure symmetrical to that of the first and second semiconductor memory elements 22 and 23. Therefore, when the third and fourth semiconductor memory elements 41 and 42 are stacked on the first and second semiconductor elements 22 and 23 the same advantages as the first embodiment can be achieved.

Figure 7:
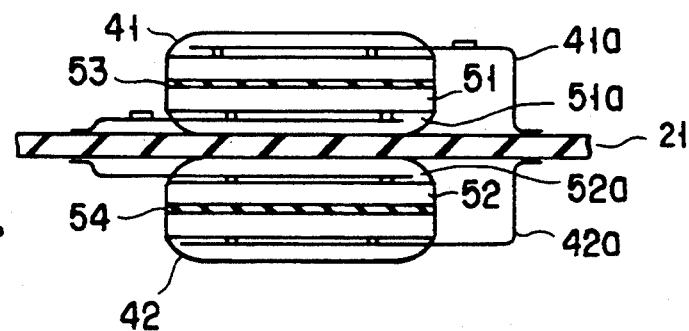
FIG. 7 is a diagram showing a cross section of the third embodiment of the present invention.
Figure 8:
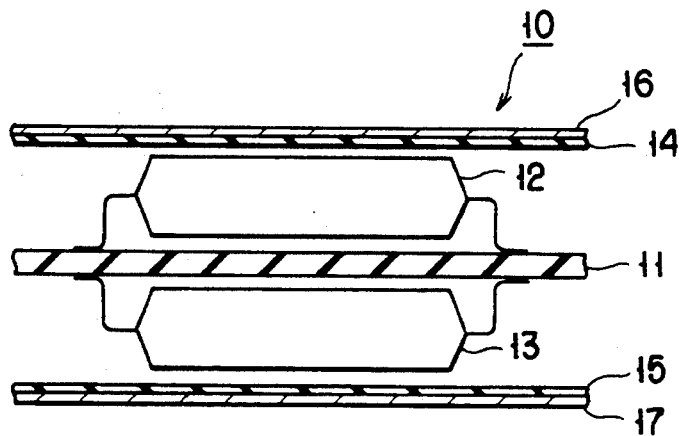
FIG. 8 is a diagram showing a cross section of the main part of an example of the conventional memory cards.
Figure 9:
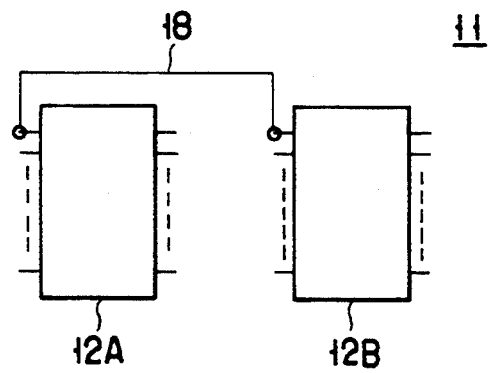
FIG. 9 is a plan view showing a cross section of the main part of an example of the wiring patterns of the conventional memory cards.

FIG. 7 shows the third embodiment of the present invention, and the same structural items as the second embodiment are designated by the same reference numerals.

In this embodiment, the first and second semiconductor memory elements 22 and 23 of the second embodiment are arranged in a back-to-back manner with respect to the third and fourth semiconductor memory elements 41 and 42. More specifically, the resin sections 51a and 52a of the first and second semiconductor memory elements 51 and 52 are brought into contact with the print circuit board 21. The outer leads of the third and fourth semiconductor memory elements 41 and 42, and those of the first and second semiconductor memory elements, which have the same function, are located at corresponding positions. An insulation film 53 is provided between the first semiconductor memory element 51 and the third semiconductor memory element 41, and an insulation film 54 is provided between the second semiconductor memory element 52 and the fourth semiconductor memory element 42.

In the third embodiment, the same advantages as the first and second embodiments can be achieved.

It should be noted that the outer leads of the semiconductor memory elements are shaped into a gull wing fashion all through the first to third embodiments; however the present invention is not limited to such a shape, and the outer leads but may be arranged in, for example, a J-bent shape.

What is claimed is:

1. A semiconductor device comprising:
   a printed circuit board;
   a first semiconductor memory element provided on one side of the printed circuit board, the first semiconductor memory element having a plurality of leads extending from one side thereof;
   a second semiconductor memory element stacked on the first semiconductor memory element in a face-to-face manner with respect to the first semiconductor memory element, the second semiconductor memory element having a plurality of leads located on a side other than said one side of the first semiconductor memory element; and
   a straight wiring pattern, provided on the printed circuit board, for connecting the leads of the first and second semiconductor memory elements having the same function.

2. A device according to claim 1, wherein each of the first and second semiconductor memory elements is a TCP (tape carrier package) type semiconductor memory element including:
   a semiconductor pellet having a plurality of bumps;
   a tape carrier having a plurality of leads formed thereon, one end of each of the leads connected to each of the bumps, and the other end of each of the leads located on one side of the tape carrier; and
   insulating resin for covering the semiconductor pellet and the tape carrier.

3. A semiconductor device comprising:
   a printed circuit board;
   first and second semiconductor memory elements provided respectively on opposite sides of the printed circuit board, the first and second semiconductor memory elements each having a plurality of leads extending from one side thereof;
   a third semiconductor memory element stacked on the first semiconductor memory element in a face-to-face manner, the third semiconductor memory element having a plurality of leads located on a side of the third semiconductor memory element not corresponding with said one side of the first semiconductor memory element;
   a fourth semiconductor memory element stacked on the second semiconductor memory element in a face-to-face manner, the fourth semiconductor memory element having a plurality of leads located on a side of the fourth semiconductor memory element not corresponding with said one side of the second semiconductor memory element;
   a first straight wiring pattern, provided on the printed circuit board, for connecting the leads of the first and third semiconductor memory elements having the same function; and
   a second straight wiring pattern, provided on the printed circuit board, for connecting the leads of the second and fourth semiconductor memory elements having the same function.

4. A device according to claim 3, wherein each of the first to fourth semiconductor memory elements is a TCP (tape carrier package) type semiconductor memory element including:
  a semiconductor pellet having a plurality of bumps;
  a tape carrier having a plurality of leads formed thereon, one end of each of the leads connected to each of the bumps, and the other end of each of the leads located on one side of the tape carrier; and
  insulating resin for covering the semiconductor pellet and the tape carrier.

5. A semiconductor memory device comprising:
  a printed circuit board;
  a first semiconductor memory element provided on one side of the printed circuit board in a predetermined vertical orientation, the first semiconductor memory element having a plurality of leads extending from one side thereof;
  a second semiconductor memory element stacked on the first semiconductor memory element in the same vertical orientation as the first semiconductor memory element, the second semiconductor memory element having a plurality of leads extending from a side thereof opposite from the one side of the first semiconductor memory element; and
  a straight wiring pattern, provided on the printed circuit board, for connecting the leads of the first and second semiconductor memory elements having the same function.

6. A device according to claim 5, wherein each of the first and second semiconductor memory elements is a TCP (tape carrier package) type semiconductor memory element including:
  a semiconductor pellet having a plurality of bumps;
  a tape carrier having a plurality of leads formed thereon, one end of each of the leads connected to each of the bumps, and the other end of each of the leads located on one side of the tape carrier; and
  insulating resin for covering the semiconductor pellet and the tape carrier.

7. A semiconductor memory device comprising:
  a printed circuit board;
  first and second semiconductor memory elements provided respectively on opposite sides of the printed circuit board in predetermined vertical orientations, the first and second semiconductor memory elements each having a plurality of leads extending from one side thereof, respectively;
  a third semiconductor memory element stacked on the first semiconductor memory element in the same vertical orientation as the first semiconductor memory element, the third semiconductor memory element having a plurality of leads located on a side of the third semiconductor memory element not corresponding with said one side of the first semiconductor memory element;
  a fourth semiconductor memory element stacked on the second semiconductor memory element in the same vertical orientation as the second semiconductor element, the fourth semiconductor memory element having a plurality of leads located on a side of the fourth semiconductor memory element not corresponding with said one side of the second semiconductor memory element;
  a first straight wiring pattern, provided on the printed circuit board, for connecting the leads of the first and third semiconductor memory elements having the same function; and
  a second straight wiring pattern, provided on the printed circuit board, for connecting the leads of the second and fourth semiconductor memory elements having the same function.

8. A device according to claim 7, wherein each of the first to fourth semiconductor memory elements is a TCP (tape carrier package) type semiconductor memory element including:
  a semiconductor pellet having a plurality of bumps;
  a tape carrier having a plurality of leads formed thereon, one end of each of the leads connected to each of the bumps, and the other end of each of the leads located on one side of the tape carrier; and
  insulating resin for covering the semiconductor pellet and the tape carrier.

9. A semiconductor memory device comprising:
  a printed circuit board;
  a first semiconductor memory element having a surface, a plurality of leads on the surface, the leads extending from one side of the surface, said surface being in contact with the print circuit board;
  a second semiconductor memory element stacked on the first semiconductor memory element in a back-to-back manner, the second semiconductor memory element having a plurality of leads located on a side of the second semiconductor memory element not corresponding with said one side of the first semiconductor memory element surface;
  an insulating member provided between the first and second semiconductor memory elements; and
  a straight wiring pattern, provided on the printed circuit board, for connecting the leads of the first and second semiconductor memory elements having the same function.

10. A device according to claim 9, wherein each of the first and second semiconductor memory elements is a TCP (tape carrier package) type semiconductor memory element including:
  a semiconductor pellet having a plurality of bumps;
  a tape carrier having a plurality of leads formed thereon, one end of each of the leads connected to each of the bumps, and the other end of each of the leads located on one side of the tape carrier; and
  insulating resin for covering the semiconductor pellet and the tape carrier.

11. A semiconductor memory device comprising: a printed circuit board;
  a first semiconductor memory element provided on one side of the printed circuit board, the first semiconductor memory element having a plurality of leads extending from one side thereof;
  a second semiconductor memory element stacked on the first semiconductor memory element, the second semiconductor memory element having a plurality of leads located on a side of the second semiconductor memory element not corresponding with said one side of the first semiconductor memory element; and
  a straight wiring pattern, provided on the printed circuit board, for connecting the leads of the first and second semiconductor memory elements having the same function;
  each of the first and second semiconductor memory elements being a TCP (tape carrier package) type semiconductor memory element further including:
  a semiconductor pellet having a plurality of bumps;
  a tape carrier having a plurality of leads formed thereon, one end of each of the leads connected to each of the bumps, and the other end of each of the leads located on one side of the tape carrier; and insulating resin for covering the semiconductor pellet and the tape carrier.

12. A semiconductor memory device comprising:

a printed circuit board; first and second semiconductor memory elements provided on opposite sides of the printed circuit board, the first and second semiconductor memory elements each having a plurality of leads extending from one side thereof;

a third semiconductor memory element stacked on the first semiconductor memory element, the third semiconductor memory element having a plurality of leads located on a side of the third semiconductor memory element not corresponding with said one side of the first semiconductor memory element;

a fourth semiconductor memory element stacked on the second semiconductor memory element, the fourth semiconductor memory element having a plurality of leads located on a side of the fourth semiconductor memory element not corresponding with said one side of the second semiconductor memory element;

a first straight wiring pattern, provided on the printed circuit board, for connecting the leads of the first and third semiconductor memory elements having the same function; and a second straight wiring pattern, provided on the printed circuit board, for connecting the leads of the second and fourth semiconductor memory elements having the same function;

each of the first to fourth semiconductor memory elements being a TCP (tape carrier package) type semiconductor memory element including:

a semiconductor pellet having a plurality of bumps;

a tape carrier having a plurality of leads formed thereon, one end of each of the leads connected to each of the bumps, and the other end of each of the leads located on one side of the tape carrier; and insulating resin for covering the semiconductor pellet and the tape carrier.

13. A memory card device comprising:

a card having a plurality of contact elements on one side surface;

a printed circuit board provided in the card;

a first semiconductor memory element provided on one side of the printed circuit board, the first semiconductor memory element having a plurality of leads on one side thereof, and controlled by a signal supplied to the contact elements;

a second semiconductor memory element stacked on the first semiconductor memory element, the second semiconductor memory element having a plurality of leads located on a side of said second semiconductor memory element not corresponding with said one side of the first semiconductor memory element, and controlled by a signal supplied from the contact elements;

a straight wiring pattern, provided on the printed circuit board, for connecting the leads of the first and second semiconductor memory elements having the same function, and guiding the signal supplied to the contact elements;

each of the first and second semiconductor memory elements being a TCP (tape carrier package) type semiconductor memory element including:

a semiconductor pellet having a plurality of bumps;

a tape carrier having a plurality of leads formed thereon, one end of each of the leads connected to each of the bumps, and the other end of each of the leads located on one side of the tape carrier; and insulating resin for covering the semiconductor pellet and the tape carrier.

14. A semiconductor memory device comprising:

a printed circuit board;

a first semiconductor memory element having first and second opposite surfaces, the first surface being in contact with the printed circuit board, the first semiconductor memory element having a plurality of first leads, a first end of the leads located in the second surface and a second end of the first leads extending from one side of the first semiconductor memory element;

a second semiconductor memory element having first and second opposite surfaces, the second surface of the second semiconductor memory element being in contact with the second surface of the first semiconductor memory element, the second semiconductor memory element having a plurality of second leads, a first end of the second leads located in the second surface of the second semiconductor memory element and a second end of the second leads located on a side of said second semiconductor memory element not corresponding with said one side of the first semiconductor memory element; and a straight wiring pattern provided on the printed circuit board for connecting the second ends of the first and second leads having the same function.

15. A semiconductor memory device comprising:

a printed circuit board;

a first semiconductor memory element having first and second opposite surfaces, the first surface being in contact with the printed circuit board, the first semiconductor memory element having a plurality of first leads, a first end of the first leads located in the first surface and a second end of the first leads extending from one side of the first semiconductor memory element;

a second semiconductor memory element having first and second opposite surfaces, the second surface of the second semiconductor memory element being in contact with the second surface of the first semiconductor memory element, the second semiconductor memory element having a plurality of second leads, a first end of the second leads located in the first surface of the second semiconductor memory element and a second end of the second leads located on a side of said second semiconductor memory element not corresponding with said one side of the first semiconductor memory element; and a straight wiring pattern, provided on the printed circuit board for connecting the second ends of the first and second leads having the same function.

* * * * *